s008822297B2

United States Patent
Lee et al.

(10) Patent No.: US 8,822,297 B2
(45) Date of Patent: Sep. 2, 2014

(54) METHOD OF FABRICATING MOS DEVICE (71) Applicant: United Microelectronics Corp., Hsinchu (TW)

(72) Inventors: Tsung-Han Lee, Tainan (TW); Cheng-Tung Huang, Kaohsiung (TW); Yi-Han Ye, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/748,279

(22) Filed: Jan. 23, 2013

(65) Prior Publication Data
US 2014/0206170 A1 Jul. 24, 2014

(51) Int. Cl.
*H01L 21/8249* (2006.01)

(52) U.S. Cl.
USPC ............... 438/302; 438/232; 257/E21.632

(58) Field of Classification Search
USPC .................. 438/302, 305, 232, 231, 229
See application file for complete search history.

(56) References Cited

U.S. PATENT DOCUMENTS

| 6,355,543 | B1 * | 3/2002 | Yu ................................. 438/535 |
| 7,396,717 | B2 * | 7/2008 | Wang et al. .................... 438/232 |
| 2007/0275532 | A1 * | 11/2007 | Chidambarrao et al. ..... 438/300 |

OTHER PUBLICATIONS

Ming-Te Wei et al., "Semiconductor Structure and Fabrication Method Thereof", Unpublished U.S. Appl. No. 13/417,337, filed Mar. 12, 2012.

* cited by examiner

*Primary Examiner* — Reema Patel
(74) *Attorney, Agent, or Firm* — J.C. Patents (57) ABSTRACT

Provided is a method of fabricating a MOS device including the following steps. At least one gate structure is formed on a substrate, wherein the gate structure includes a gate conductive layer and a hard mask layer disposed on the gate conductive layer. A first implant process is performed to form source and drain extension regions in the substrate, wherein the gate conductive layer is covered by the hard mask layer. A process is of removing the hard mask layer is performed to expose the surface of the gate conductive layer. A second implant process is performed to form pocket doped regions in the substrate, wherein the gate conductive layer is not covered by the hard mask layer.

14 Claims, 8 Drawing Sheets

METHOD OF FABRICATING MOS DEVICE

BACKGROUND

1. Technical Field

The present invention relates to a method of fabricating a semiconductor device, and more particularly, to a method of fabricating a metal oxide semiconductor (MOS) field effect transistor device.

2. Description of Related Art

Metal oxide semiconductor field effect transistor (MOS-FET) is a basic structure widely applied to various semiconductor devices such as memory devices, image sensors, and display devices. To meet the demand of lighter, thinner, and smaller electronic devices, the size of CMOS is continuously shrunk. Accompanying the miniaturization, however, comes the short channel effect which reduces the threshold voltage of a MOS device. Note that "short channel effect" is a general term covering numerous leakage mechanisms such as, to name a few, junction leakage, sub-threshold leakage, gate oxide tunnelling, hot-carrier injection, gate-induced drain leakage, and punch-through leakage. To avoid the problem, techniques like forming lightly doped drains having ultra shallow junction and pocket implant (halo implant) have been proposed. However, pocket implant is an angled implant process, and as the device scale reduces to 90 nm or smaller, it is more and more difficult to form the pocket doped region with accurate position and adequate dose.

SUMMARY

The present invention is directed to a method of fabricating a MOS device, including the following steps. At least one gate structure is formed on a substrate, wherein the gate structure includes a gate conductive layer and a hard mask layer disposed on the gate conductive layer. A first implant process is performed to form first source and drain extension regions in the substrate, wherein the gate conductive layer is covered by the hard mask layer. A remove process to remove the hard mask layer is performed to expose the surface of the gate conductive layer. A second implant process is performed to form first pocket doped regions in the substrate, wherein the gate conductive layer is not covered by the hard mask layer.

In an embodiment, the second implant process includes an amorphizing step, a co-implant step, and a pocket implant step.

In an embodiment, the implant species of the amorphizing step is germanium.

In an embodiment, the implant of the co-implant step is carbon.

In an embodiment, the dopant of the pocket implant step is $BF_2^+$.

In an embodiment, the substrate includes a first region and a second region, and the at least one gate structure includes a first gate structure disposed on the first region and a second gate structure disposed on the second region. The second implant process includes a first pocket implant process and a second pocket implant process. In the first pocket implant process, the first region and the second region are exposed for implanting. In the second pocket implant process, the second region is exposed for implanting and the first region is protected from implanting.

In an embodiment, the first pocket implant process includes an amorphizing step, a co-implant step, and a first pocket implant step, and the second pocket implant process includes a second pocket implant step.

In an embodiment, the substrate includes a first region and a second region, and the at least one gate structure includes a first gate structure disposed on the first region and a second gate structure disposed on the second region. The method of fabricating a MOS device includes the following steps. The first implant process is performed to form the first source and drain extension regions in the substrate at both sides of the first gate structure, wherein the first source and drain extension regions are n-doped regions. A third implant process is performed to form second source and drain extension regions and second pocket doped regions in the substrate at both sides of the second gate structure, wherein the second source and drain extension regions are p-doped regions and second pocket doped regions are n-doped regions. Stress-generating layers are formed in the substrate at the both sides of the second gate structures. The remove process to remove the hard mask layer and expose the surface of the gate conductive layer is performed. The second implant process is performed to form the first pocket doped regions in the substrate at both sides of the first gate structure, wherein the first pocket doped regions are p-doped regions.

In an embodiment, spacers are formed on sidewalls of the first gate structure and sidewalls of the second gate structure before performing the first implant process.

In an embodiment, a laser spike annealing process is performed before the third implant process.

In an embodiment, a disposable layer is formed on the first region before forming the stress-generating layers in the substrate at the both sides of the second gate structures, and the disposable layer is removed after the formation of the stress-generating layers in the substrate at the both sides of the second gate structures.

In an embodiment, dummy spacers are formed on sidewalls of the first gate structure and sidewalls of the second gate structure before the remove process to remove the hard mask layer and expose the surface of the gate conductive layer.

In an embodiment, a mask layer is formed on the second region before performing the second implant process.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the embodiments of the invention, examples of which are illustrated in the accompanying drawings. Wherever possible, the same reference numbers are used in the drawings and the description to refer to the same or like elements.

FIGS. 1A-1J are schematic cross-sectional drawings illustrating a method of fabricating a MOS device according to an embodiment of the invention.

Figure 1A:
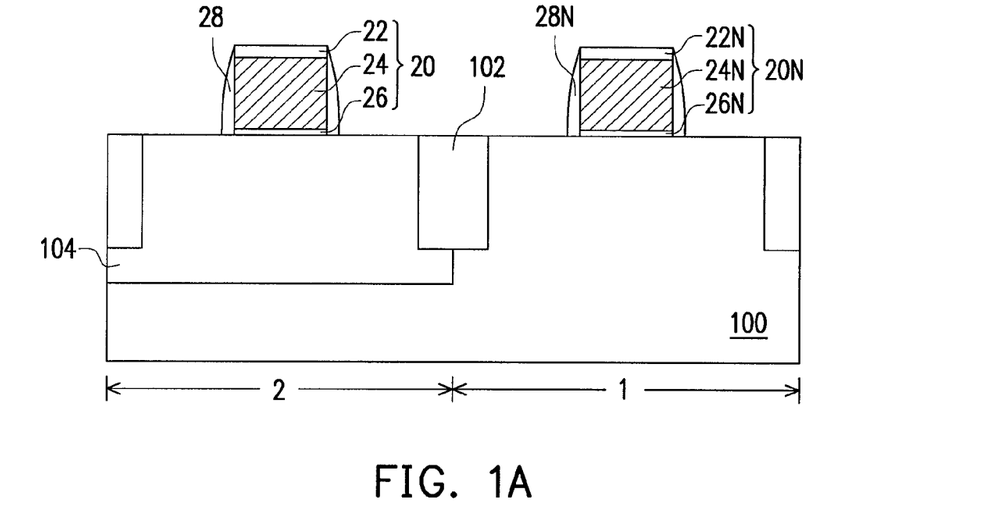
FIGS. 1A-1J are schematic cross-sectional drawings illustrating a method of fabricating a MOS device according to an embodiment of the invention.

Referring to FIG. 1A, a substrate 100 such as a silicon substrate, a silicon-containing substrate, or a silicon-on-insulator (SOI) substrate is provided. The substrate 100 has a region 1 and a region 2 disposed therein. An isolation structure 102 such as shallow trench isolation (STI) is formed in the substrate 100 between the region 1 and the region 2, providing electrical isolation therebetween. In this embodiment, the substrate 100 may be a P-type substrate and an N-well 104 is formed in the region 2. In the subsequent fabrication process, an NMOS can be formed in the region 1, and a PMOS in the region 2.

Continue referring to FIG. 1A, a gate structure 20 is formed on the N-well 104 in the region 2 and a gate structure 20N is formed on the region 1. The gate structure 20 includes a gate dielectric layer 26, a gate conductive layer 24, and a hard mask layer 22 formed bottom to top. Material of the hard mask layer 22 is, for example, silicon nitride, or the hard mask layer 22 can be a stacked structure consisting of a silicon oxide layer and a silicon nitride layer. Material of the gate conductive layer 24 is, for example, doped polysilicon. The gate dielectric layer 26 can be a silicon oxide ($SiO_2$) layer, a high-k gate dielectric layer with a dielectric constant greater than 4, or the combination thereof. The high-k material with a dielectric constant greater than 4 can be metal oxide, such as rare earth metal oxide. The high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. Additionally, an interfacial layer (not shown) can be formed between the high-k gate dielectric layer and the substrate 100. The interfacial layer can be silicon oxide. Further, on the sidewalls of the gate structure 20, spacers 28 may be formed, of which the material can be silicon oxide.

Similarly, the gate structure 20N includes a gate dielectric layer 26N, a gate conductive layer 24N, and a hard mask layer 22N formed bottom to top. Spacers 28N may be formed on the sidewalls of the gate structure 20N. The components of gate structure 20N may be made of the same or similar materials as those of the components of the gate structure 20. The elements, structures, and layers depicted in FIG. 1A may be formed by methods or processes known to a person having ordinary skills in the art. The details are thus omitted here for brevity.

Figure 1B:
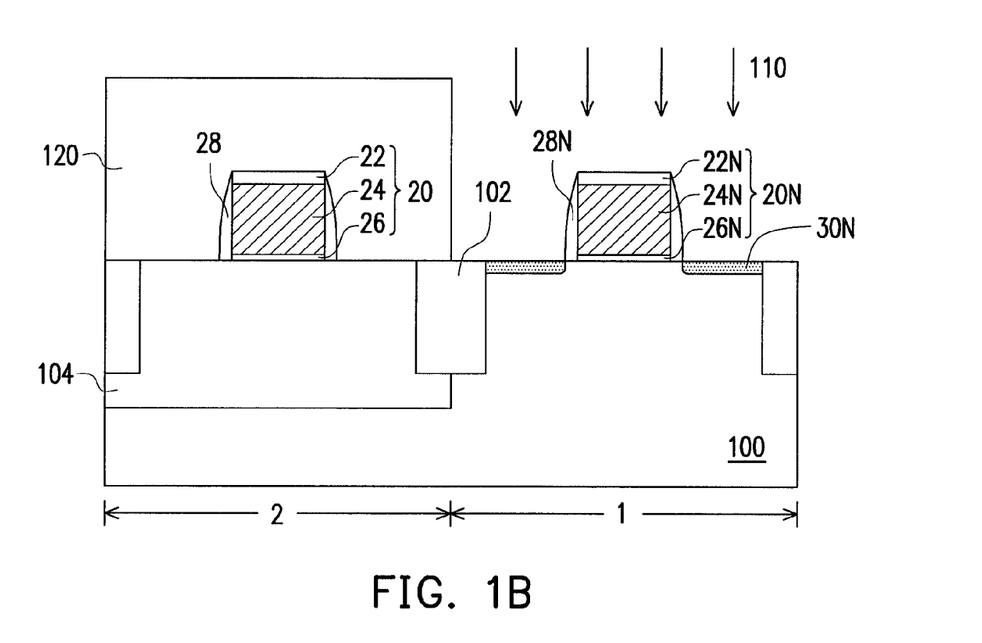

Referring to FIG. 1B, an implant process 110 is performed to form source and drain extension regions 30N in the region 1. In an embodiment, the source and drain extension regions 30N are n-type lightly doped drains (NLDDs) disposed at both sides of the gate structure 20N. The dopants of the implant process 110 is, for example, arsenic (As) or phosphorous (P). During the implant process 110, the gate conductive layer 24N is covered by the hard mask layer 22N, and the region 2 may be covered by a mask layer 120 during the implant process 110. The mask layer 120 may consist of a photoresist material. Further, an annealing process, e.g. a laser spike annealing (LSA) may be conducted to activate the dopants in the source and drain extension regions 30N and relax the lattice mismatch caused by the implant process 110.

Figure 1C:
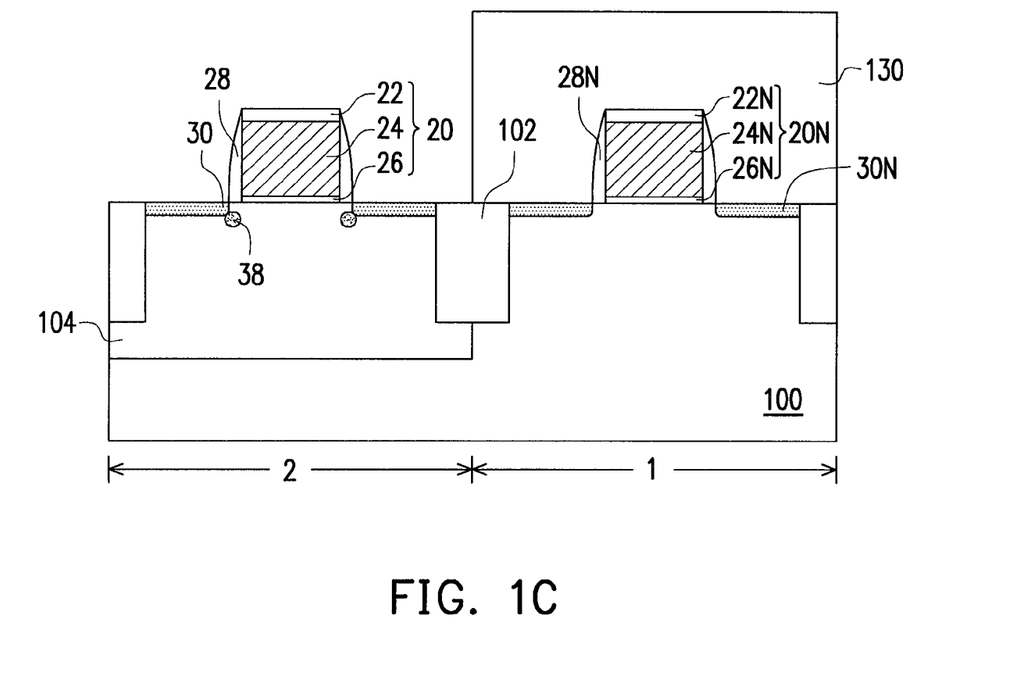

Referring to FIG. 1C, the mask layer 120 is removed, and another mask layer 130 made of, for example, a photoresist material can be formed on the region 1. The source and drain extension regions 30 may be formed in the substrate 100 at both sides of the gate structure 20 by another implant process, of which the dopants may be boron (B) or gallium (Ga) respectively. In such an embodiment, the source and drain extension regions 30 are p-type lightly doped drains (PLDDs). Then, n-type pocket implant regions 38 are formed by a pocket implant process. Note this pocket implant process (i.e. forming n-type pocket doped regions in the N-well 104) is typically an angled implant process with a first tilt angle, and do not encounter the problem where movement of dopants are impeded by the gate structure and cannot reach the target region. The problem, sometimes referred to as the shadowing effect, will be described in more detail below.

Figure 1D:
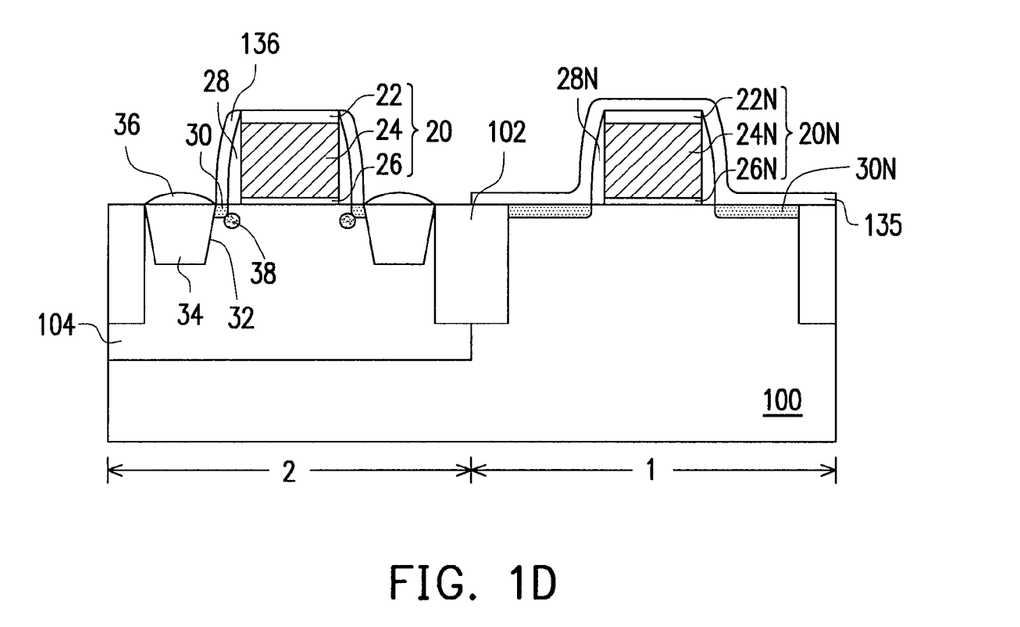
Figure 1E:
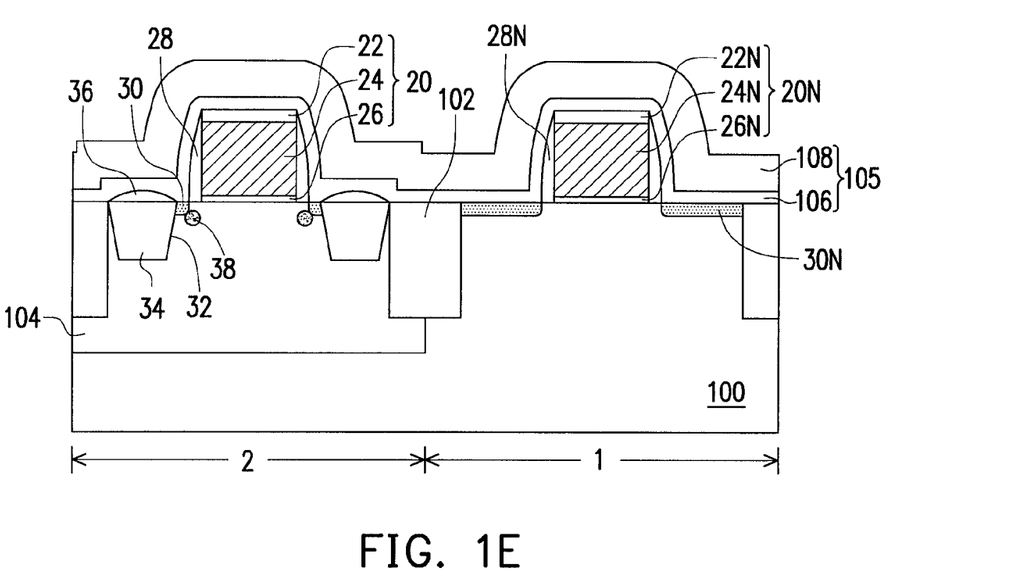

Then, referring to FIG. 1D, the mask layer 130 is removed. A disposable material layer (not shown) are formed on the substrate 100 and subsequently subjected to an etching process with a mask (e.g. photoresist, not shown) covering the region 1 to form a disposable layer 135 on the region 1 and disposable spacers 136 adjacent to the spacers 28. The mask is then removed. Openings 32 may be formed in the substrate 100 at both sides of the gate structure 20 by, for example, a dry etching process. A stress-generating material is then grown to fill the openings 32 to form stress-generating layers 34. For an N-well in a silicon substrate, the stress-generating material can be SiGe. The SiGe growth can be carried out by, for example, epitaxial growth. Specifically, each of the stress-generating layers 34 may be composed of an un-doped SiGe layer and a doped SiGe layer stacked in sequence. Silicon caps 36 may be subsequently formed on the stress-generating layers 34 for later silicide formation. The disposable layer 135 and the disposable spacer 136 are removed after the formation of the stress-generating layers 34.

Figure 1F:
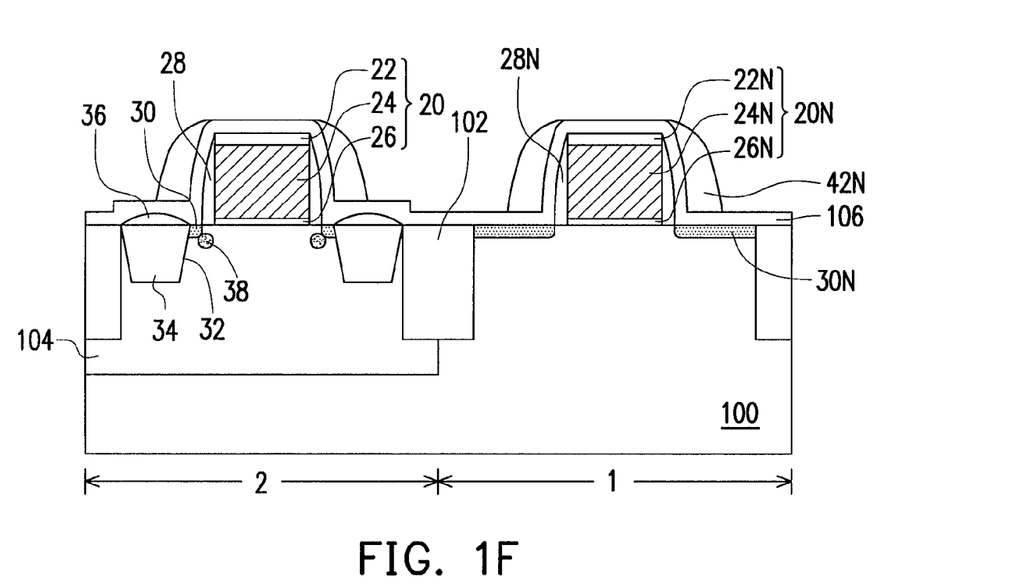
Figure 1G:
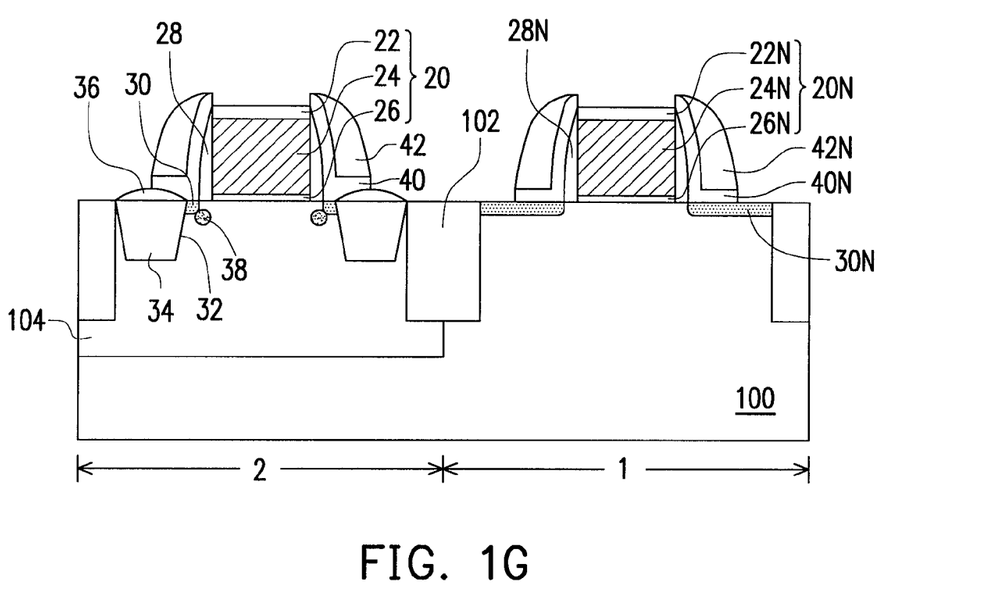
Figure 1H:
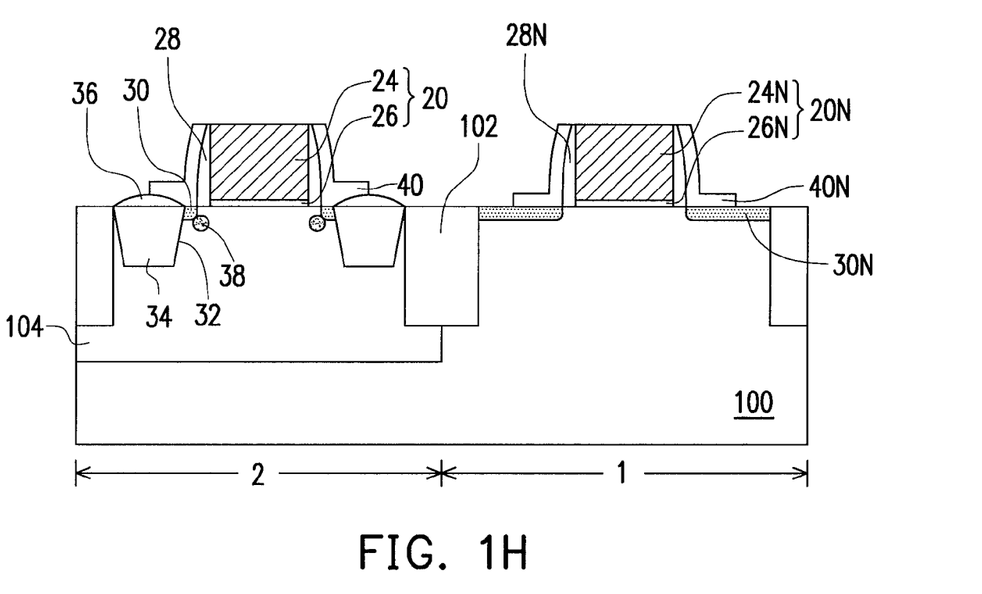

Referring to FIGS. 1E-1H, a spacer material layer 105 is formed on the substrate 100. In this embodiment, the spacer material layer 105 includes a silicon oxide layer 106 and a silicon nitride layer 108. These layers may be formed by chemical vapor deposition. A portion of the silicon nitride layer 108 is then removed by, for example, a dry etching process, so that silicon nitride spacers 42N are formed at the sidewalls of the gate structures 20 and 20N, and a portion of the silicon oxide layer 106 is exposed (FIG. 1F). The exposed portion of silicon oxide layer 106 is then removed by a wet etching process having different etching rates with respect to silicon oxide and silicon nitride, leaving silicon oxide spacers 40 and the silicon nitride spacers 42 disposed adjacent to the sidewalls of the gate structures 20, and silicon oxide spacers 40N and silicon nitride spacers 42N adjacent to the sidewalls of the gate structures 20N (FIG. 1G). Subsequently, a wet etching process can be performed to remove the hard mask layers 22 and 22N as well as silicon nitride spacers 42 and 42N to expose silicon oxide spacers 40 and 40N as well as the top surfaces of the gate conductive layers 24 and 24N (FIG. 1H). Silicon nitride spacers 42 and 42N are sometimes referred as "dummy spacers" since they are temporarily present for the purpose of protecting silicon oxide spacers 40 and 40N and are removed with the hard mask layers 22 and 22N.

Figure 1I:
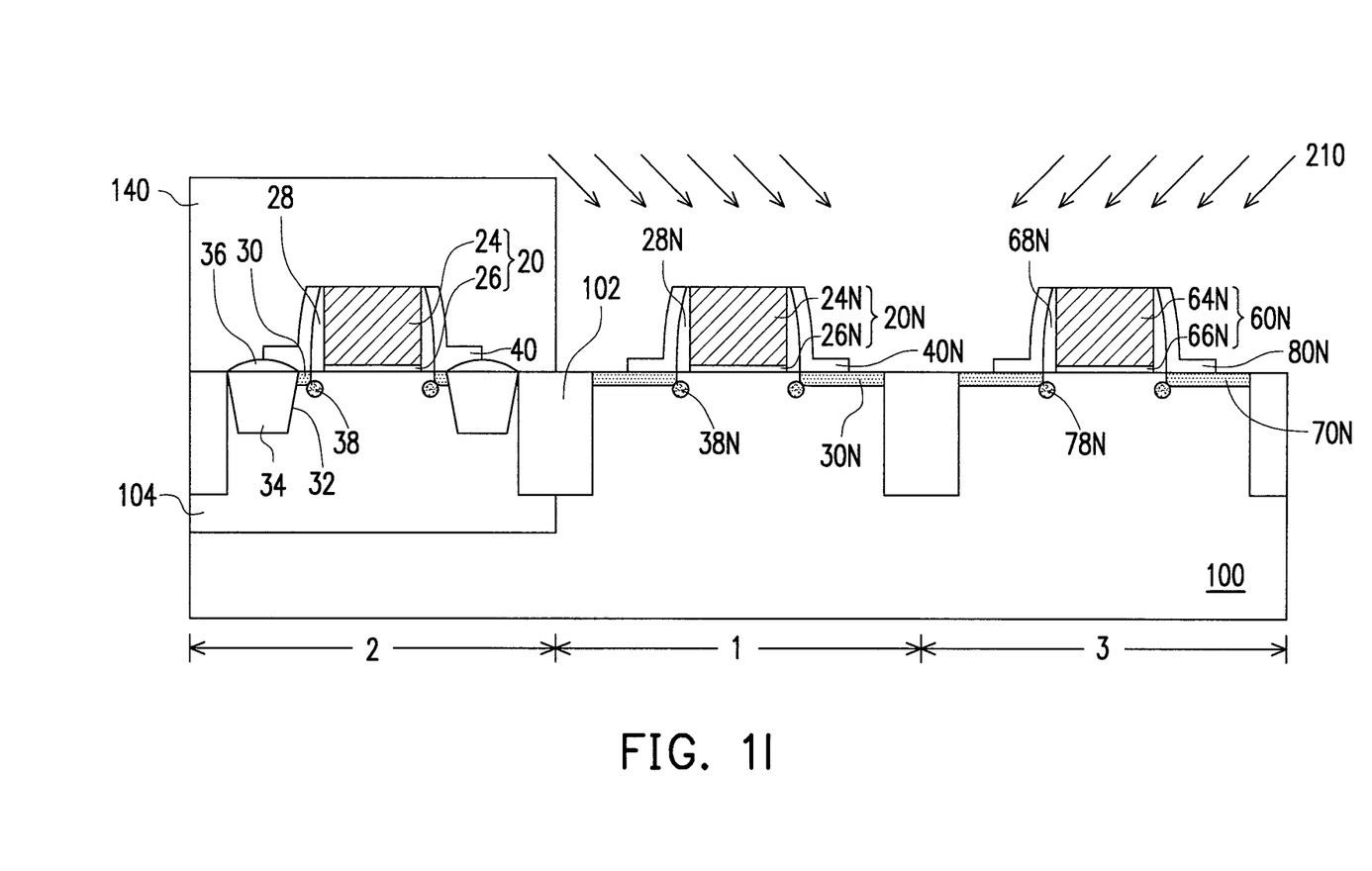
Figure 1J:
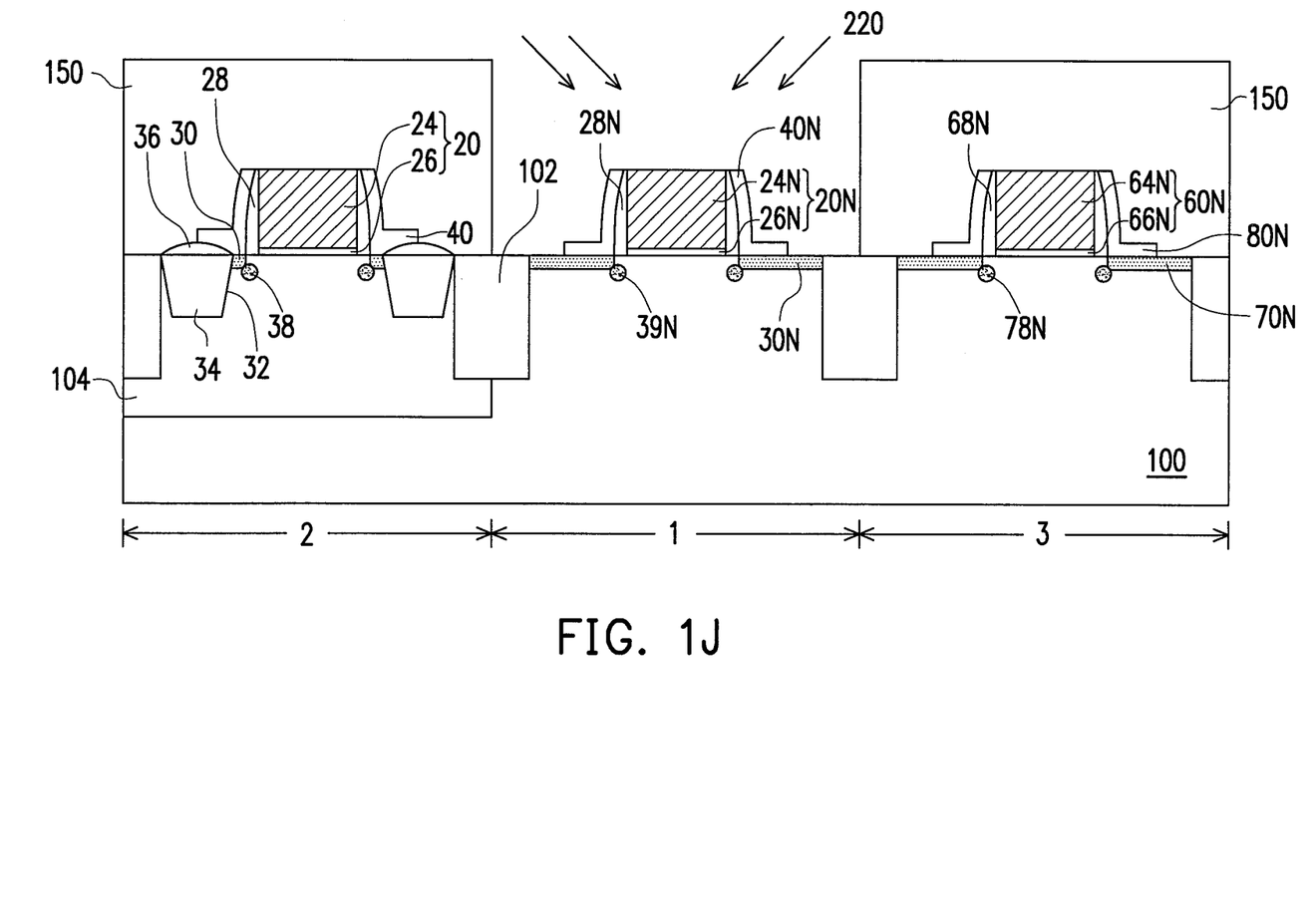

FIG. 1I shows a step of the fabricating process after the step depicted in FIG. 1H; however, FIG. 1I further illustrates a region 3 adjacent to the region 1 of the substrate 100. A gate structure 60N including a gate dielectric layer 66N and a gate conductive layer 64N is formed on the region 3. Spacers 68N and 80N are disposed adjacent to sidewalls of the gate structure 60N. Source and drain extension regions 70N are formed in the substrate 100 at both sides of the gate structure 60N. The gate structure 60N, the spacers 68N and 80N, and the source and drain extension regions 70N can be identical to and formed simultaneously as the corresponding ones in or on the region 1.

Referring to FIG. 1I, a mask layer 140 made of, for example, a photoresist material, is formed on the region 2. A pocket implant process 210 with a second tilt angle is performed to form pocket doped regions 38N in the region 1 and pocket doped region 78N in the region 3. The dopant can be $BF_2^+$. Note that in this process, the gate conductive layers 24N and 64N are no longer covered by the hard mask layers, resulting in the reduction of the height of the gate structures 20N and 60N.

Different from the implant process for the source and drain extension regions, the direction of implant in the pocket implant process is deviated from the surface normal of the substrate 100, i.e. it is a tilt implant with a tilt angle typically of 30°. The second tilt angle of the pocket implant 210 is larger than the first tilt angle used to form the n-type pocket regions 38. As the dimension of MOS devices continuously shrunk, adjacent gate structures may impede the movement of dopants in a tilt implant process. For example, referring to FIG. 1I, if the spacing between the gate structures 20N an 60N is small, and the height of gate structure 60N is too large, a portion of dopants to be implanted into pocket doped regions 38N would be blocked by the gate structure 60N, or, to state in another way, the area of pocket doped regions 38N is shadowed from implant by the gate structure 60N, leading the pocket doped region 38N shift from its desired location or have an insufficient dose. The present embodiment solves the aforementioned issue by postponing the pocket implant process 210 until the hard mask is removed. Since the effective height of gate structures 60N is reduced, the shielding problem is ameliorated.

After the step depicted in FIG. 1H but prior to the pocket implant process 210, an optional amorphizing step implanting, for example, germanium, into the source and drain extension regions 30N and 70N may be conducted to amorphize the source and drain regions 30N and 70N in the region 1 and the region 3. An optional co-implant step can also be conducted to implant carbon atoms into the same regions. Both steps are carried out for the purpose of trapping the dopants in the source and drain regions, preventing conduction path formation in the channel region. It should be noticed that the amorphizing step, the co-implant step, and the pocket implant step 210 can be conducted with a same photoresist layer (i.e. exposing the region 1 and the region 3). Moreover, although in this embodiment, these steps are carried out in the order of the amorphizing step first, then the co-implant step, and finally the pocket implant step 210, the invention is not limited thereto. It is possible to vary the order of these steps.

The formation of doped pocket regions can prevent the punch-through phenomenon of the MOS device. However, there are circumstances while different devices on a single wafer require different threshold voltages. Consider, for example, in the present embodiment, devices to be formed on the region 1 require a first threshold voltage, and devices to be formed on the region 3 require a second threshold voltage, wherein, for example, the first threshold voltage is greater than the second threshold voltage. It is thus proposed that, the aforementioned amorphizing step, co-implant step, and pocket implant step 210 can be performed with one photoresist layer (e.g. mask layer 140) exposing the region 1 and the region 3, and, after completing these steps, another pocket implant step 220 is performed with a mask layer 150 only exposing the regions 1 (See FIG. 1J). As a result, the pocket doped regions 39N will be more heavily doped as compared to the pocket doped region 78N.

Figure 2A:
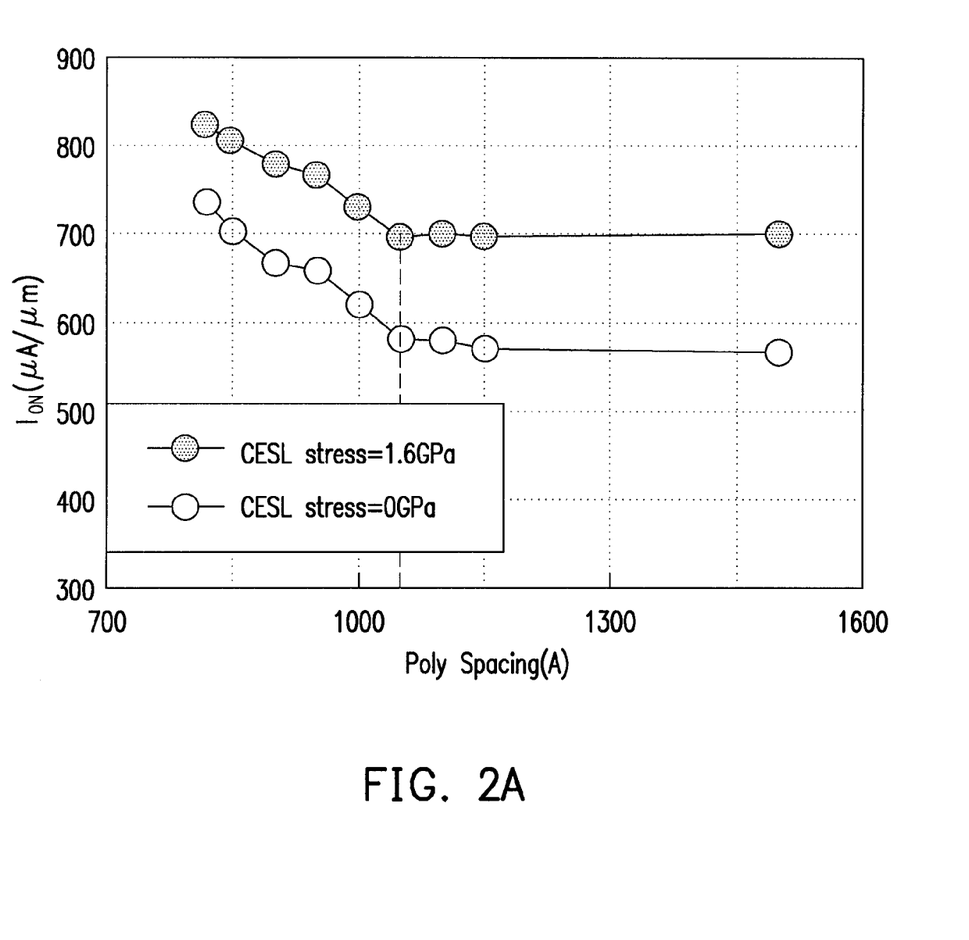
FIG. 2A shows the result of a simulated experiment.

Experiment and inference therefrom are presented below to further demonstrate the effect of the present invention. First, referring to FIG. 2A, a poly spacing effect simulation is conducted for MOS devices fabricated by a conventional BSL (baseline) process, which includes a pocket implant process (tilt angle=30°) performed with a hard mask layer disposed on the gate conductive layer. The stresses of the contact etch stop layers (CESL) of the simulation examples are, respectively, 1.6 GPa and 0 GPa. As shown in FIG. 2A, the turn-on current $I_{ON}$ of the MOS devices varies with the spacing of gate structures (denoting as Poly Spacing in the figure); when poly spacing decreases below 1050 Å, shadowing effect (i.e. adjacent gate structures obstruct the pocket implant process, causing increase of $I_{ON}$) occurs, but no obvious shadowing effect is observed at a poly spacing between 1050 Å-1500 Å.

Figure 2B:
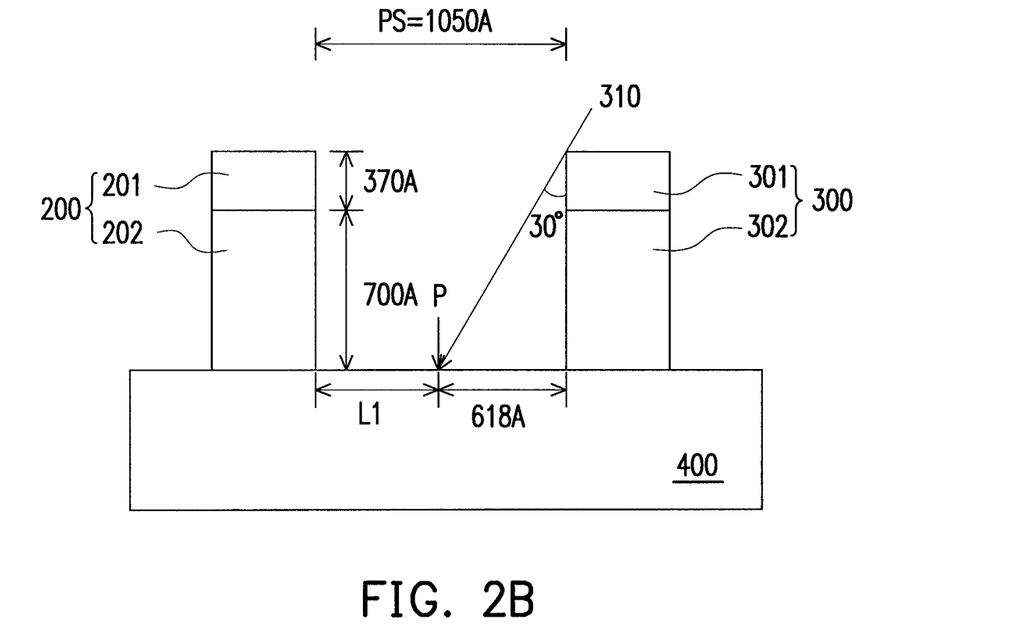
FIG. 2B is the cross-sectional view of simulated devices in connection to FIG. 2A.

FIG. 2B shows the corresponding cross-sectional views of devices subjected to an angled implant process 310 in the BSL process, as discussed in connection to FIG. 2A. Here, gate structure 200 including a hard mask 201 and a conductive portion 202 and gate structure 300 including a hard mask 301 and a conductive portion 302 are disposed on a substrate 400. The poly spacing, i.e. the horizontal distance between the gate structures 200 and 300, is 1050 Å, the minimum of poly spacing for a successful pocket implant in the BSL process. The horizontal distance L1 between the gate structure 200 and the point p can be calculated by simple geometry, provided that the tilt angle of the implant process 310 (in this case, 30°) and the height of gate structure 300 are known. That is, L1=1050 Å−(700 Å+370 Å)×tan 30°=1050 Å-618 Å=432 Å. The region of the substrate 400 extending leftward from point p is not shadowed by the gate structure 300 and can be successfully implanted. Distance L1 thus is considered as a threshold for a successful angled implant.

Figure 2C:
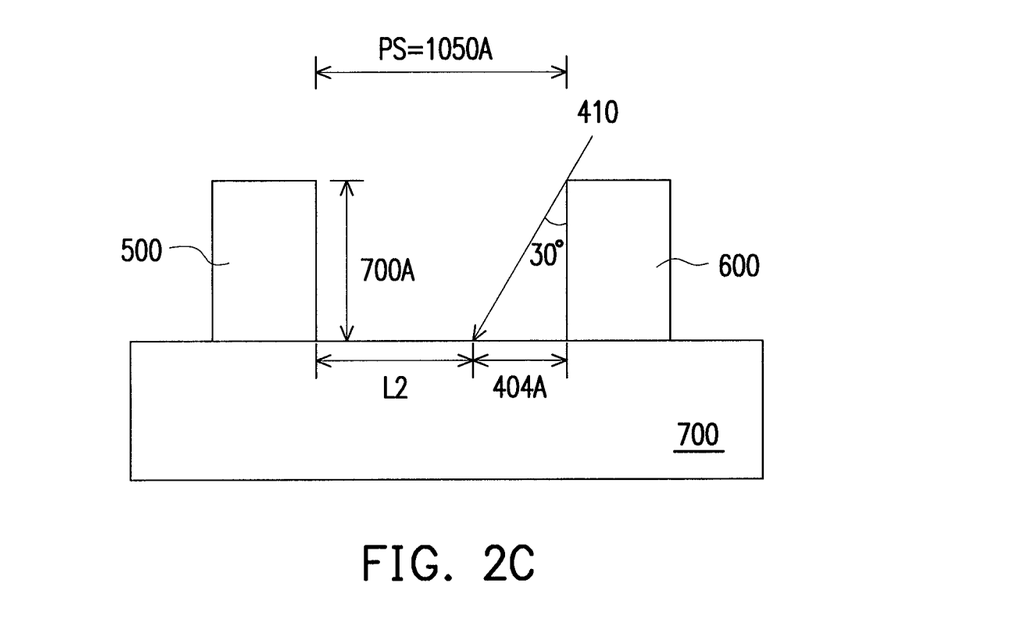
FIG. 2C is a cross-sectional view of an embodiment of the present invention.

Now turn to FIG. 2C, in which the inventive scheme where gate structures 500 and 600 without the hard mask are disposed on a substrate 700 is shown. The poly spacing is also equal to 1050 Å. An implant process 410 with 30° tilt is performed. L2, calculated by the same method, is equal to 646 Å. Since L2 (646 Å) is significantly greater than L1 (432 Å), an angled implant process with 30° tilt at a poly spacing of 860 Å will not induce shadowing effect. That is, compared to the conventional process, pocket doped regions can be more adequately formed.

Accordingly, the present invention provides a method of fabricating a MOS device. In the inventive fabrication method, the pocket implant process is carried out after removing the hard mask layer on the gate conductive layer. Pocket doped regions can be accurately formed ("accurately" here referring both to the location and to the dose amount), even if the spacing of gate structures is further reduced as compared to the conventional process. Silicon recess is also reduced in this process. The performance of the MOS device is consequently improved.

The present invention has been disclosed above in the embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of fabricating a MOS device comprising:
   forming at least one gate structure on a substrate, wherein the gate structure comprises a gate conductive layer and a hard mask layer disposed on the gate conductive layer;

performing a first implant process to form first source and drain extension regions in the substrate, wherein the gate conductive layer is covered by the hard mask layer;

performing a remove process to remove the hard mask layer and expose a surface of the gate conductive layer; and after the step of performing a first implant process, performing a second implant process to form first pocket doped regions in the substrate, wherein the gate conductive layer is not covered by the hard mask layer, wherein the second implant process comprises an amorphizing step, a co-implant step, and a pocket implant step.

2. The method of claim 1, wherein an implant species of the amorphizing step includes germanium.

3. The method of claim 1, wherein an implant of the co-implant step includes carbon.

4. The method of claim 1, wherein a dopant of the pocket implant step includes $BF_2^+$.

5. The method of claim 1, further comprising forming a first spacer on a sidewall of the gate structure before the step of performing the first implant process, wherein at least a portion of the first pocket doped regions is located in the substrate directly under the first spacer.

6. The method of claim 5, further comprising forming a second spacer on a sidewall of the first spacer before the step of performing the second implant process, wherein at least a portion of the first pocket doped regions is formed in the substrate directly under the first spacer between the gate structure and the second spacer.

7. A method of fabricating a MOS device comprising:
forming at least one gate structure on a substrate, wherein the gate structure comprises a gate conductive layer and a hard mask layer disposed on the gate conductive layer;
performing a first implant process to form first source and drain extension regions in the substrate, wherein the gate conductive layer is covered by the hard mask layer;
performing a remove process to remove the hard mask layer and expose a surface of the gate conductive layer; and
performing a second implant process to form first pocket doped regions in the substrate, wherein the gate conductive layer is not covered by the hard mask layer,
wherein the substrate comprises a first region and a second region, and the at least one gate structure comprises a first gate structure disposed on the first region and a second gate structure disposed on the second region, and the second implant process comprises:
a first pocket implant process wherein the first region and the second region are exposed for implanting; and
a second pocket implant process wherein the second region is exposed for implanting and the first region is protected from implanting.

8. The method of claim 7, wherein the first pocket implant process comprises an amorphizing step, a co-implant step, and a first pocket implant step, and the second pocket implant process comprises a second pocket implant step.

9. A method of fabricating a MOS device comprising:
forming at least one gate structure on a substrate, wherein the gate structure comprises a gate conductive layer and a hard mask layer disposed on the gate conductive layer;
performing a first implant process to form first source and drain extension regions in the substrate, wherein the gate conductive layer is covered by the hard mask layer;
performing a remove process to remove the hard mask layer and expose a surface of the gate conductive layer; and
performing a second implant process to form first pocket doped regions in the substrate, wherein the gate conductive layer is not covered by the hard mask layer,
wherein the substrate comprises a first region and a second region, and the at least one gate structure comprises a first gate structure disposed on the first region and a second gate structure disposed on the second region, the method of fabricating a MOS device comprising:
performing the first implant process to form the first source and drain extension regions in the substrate at both sides of the first gate structure wherein the first source and drain extension regions are n-doped regions;
performing a third implant process to form second source and drain extension regions and second pocket doped regions in the substrate at both sides of the second gate structure wherein the second source and drain extension regions are p-doped regions and the second pocket doped regions are n-doped regions;
forming stress-generating layers in the substrate at the both sides of the second gate structures;
performing the remove process to remove the hard mask layer and expose the surface of the gate conductive layer; and
performing the second implant process to form the first pocket doped regions in the substrate at the both sides of the first gate structure wherein the first pocket doped regions are p-doped regions.

10. The method of claim 9, further comprising forming spacers on sidewalls of the first gate structure and sidewalls of the second gate structure before performing the first implant process.

11. The method of claim 9, further comprising performing a laser spike annealing process before the third implant process.

12. The method of claim 9, further comprising:
forming a disposable layer on the first region before forming the stress-generating layers in the substrate at the both sides of the second gate structures; and
removing the disposable layer after forming the stress-generating layers in the substrate at the both sides of the second gate structures.

13. The method of claim 9, further comprising:
forming dummy spacers on sidewalls of the first gate structure and sidewalls of the second gate structure before the remove process to remove the hard mask layer and expose the surface of the gate conductive layer.

14. The method of claim 9, further comprising:
forming a mask layer on the second region before performing the second implant process.

* * * * *